United States Patent
Inamasu et al.

(10) Patent No.: US 12,381,083 B2
(45) Date of Patent: *Aug. 5, 2025

(54) BONDING APPARATUS AND BONDING METHOD

(71) Applicant: Tokyo Electron Limited, Tokyo (JP)

(72) Inventors: Toshifumi Inamasu, Koshi (JP); Shinichi Shinozuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 640 days.

This patent is subject to a terminal disclaimer.

(21) Appl. No.: 17/661,100

(22) Filed: Apr. 28, 2022

(65) Prior Publication Data

US 2022/0254636 A1    Aug. 11, 2022

Related U.S. Application Data

(63) Continuation of application No. 16/884,291, filed on May 27, 2020, now Pat. No. 11,348,791.

(30) Foreign Application Priority Data

May 28, 2019    (JP) .................. 2019-099179

(51) Int. Cl.
   *B32B 41/00* (2006.01)
   *B23P 19/10* (2006.01)
   (Continued)

(52) U.S. Cl.
   CPC ............ *H01L 21/187* (2013.01); *B23P 19/10* (2013.01); *B23P 21/00* (2013.01); *B23Q 17/22* (2013.01);
   (Continued)

(58) Field of Classification Search
   CPC ............. H01L 21/187; H01L 21/67121; H01L 21/681; H01L 21/185; H01L 21/67092;
   (Continued)

(56) References Cited

U.S. PATENT DOCUMENTS 10,340,248 B2 * 7/2019 Matsunaga ........ H05K 13/0061
11,348,791 B2 * 5/2022 Inamasu ............... H01L 21/187
(Continued)

FOREIGN PATENT DOCUMENTS

JP    H11-312898 A    11/1999
JP    2006-091623 A    4/2006
(Continued)

*Primary Examiner* — Michael N Orlando
*Assistant Examiner* — Joshel Rivera
(74) *Attorney, Agent, or Firm* — Chrisman Gallo Tochtrop LLC

(57) ABSTRACT

A bonding apparatus configured to bond a first substrate and a second substrate includes a first holder configured to hold the first substrate; a second holder configured to hold the second substrate; a first imaging device provided at the first holder and configured to image the second substrate held by the second holder; a first light irradiating device provided at the first holder and configured to irradiate light to the second substrate when the second substrate is imaged; a second imaging device provided at the second holder and configured to image the first substrate held by the first holder; and a second light irradiating device provided at the second holder and configured to irradiate light to the first substrate when the first substrate is imaged. Each of the first light irradiating device and the second light irradiating device is connected to a first light source configured to irradiate white light.

12 Claims, 12 Drawing Sheets

(51) Int. Cl.
*B23P 21/00* (2006.01)
*B23Q 17/22* (2006.01)
*B23Q 17/24* (2006.01)
*H01L 21/18* (2006.01)
*H01L 21/67* (2006.01)
*H01L 21/68* (2006.01)

(52) U.S. Cl.
CPC ......... *B23Q 17/24* (2013.01); *B23Q 17/2428* (2013.01); *H01L 21/67121* (2013.01); *H01L 21/681* (2013.01); *Y10T 29/5317* (2015.01); *Y10T 156/10* (2015.01)

(58) Field of Classification Search
CPC .... H01L 21/67259; B23P 19/10; B23P 21/00; B23Q 17/22; B23Q 17/24; B23Q 17/2428; Y10T 29/5317; Y10T 156/10; B23K 20/00

USPC ................... 156/60, 64, 350, 351, 378, 379
See application file for complete search history.

(56) References Cited

U.S. PATENT DOCUMENTS

| | | |
|---|---|---|
| 2008/0013089 A1 | 1/2008 | Ishii et al. |
| 2012/0318432 A1* | 12/2012 | Nishibayashi .... H01L 21/67092 |
| | | 156/379 |
| 2018/0144999 A1* | 5/2018 | Lu ........................... H01L 24/94 |
| 2020/0020553 A1* | 1/2020 | Otsuka ................ H01L 21/6833 |

FOREIGN PATENT DOCUMENTS

| | | |
|---|---|---|
| JP | 2009-147257 A | 7/2009 |
| JP | 2014-138038 A | 7/2014 |
| JP | 2015-018919 A | 1/2015 |
| WO | 2006/025386 A1 | 3/2006 |

* cited by examiner

BONDING APPARATUS AND BONDING METHOD

CROSS-REFERENCE TO RELATED APPLICATION

This is a continuation application of U.S. Ser. No. 16/884,291 filed on May 27, 2020, which claims the benefit of Japanese Patent Application No. 2019-099179 filed on May 28, 2019, the entire disclosures of which are incorporated herein by reference.

TECHNICAL FIELD

The various aspects and embodiments described herein pertain generally to a bonding apparatus and a bonding method.

BACKGROUND

Patent Document 1 discloses a method of a position adjustment between a reticle provided with a circuit pattern and a pattern formed on a wafer in an exposure apparatus. According to Patent Document 1, an image of an alignment mark provided on the wafer and an image of an indicator mark on an indicator plate provided within a surface commonly shared with the wafer are captured by an objective lens or the like. In this imaging process, illumination light having a preset wavelength band is irradiated onto the wafer via an optical fiber. Alternatively, without using the optical fiber, the wafer may be illuminated by reflection light reflected from a mirror or a contact lamp.

Patent Document 1: International Publication No. 2006/025386

SUMMARY

In one exemplary embodiment, a bonding apparatus configured to bond a first substrate and a second substrate includes a first holder configured to hold the first substrate; a second holder configured to hold the second substrate; a first imaging device provided at the first holder and configured to image the second substrate held by the second holder; a first light irradiating device provided at the first holder and configured to irradiate light to the second substrate when the second substrate is imaged by the first imaging device; a second imaging device provided at the second holder and configured to image the first substrate held by the first holder; and a second light irradiating device provided at the second holder and configured to irradiate light to the first substrate when the first substrate is imaged by the second imaging device. Each of the first light irradiating device and the second light irradiating device is connected to a first light source configured to irradiate white light.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
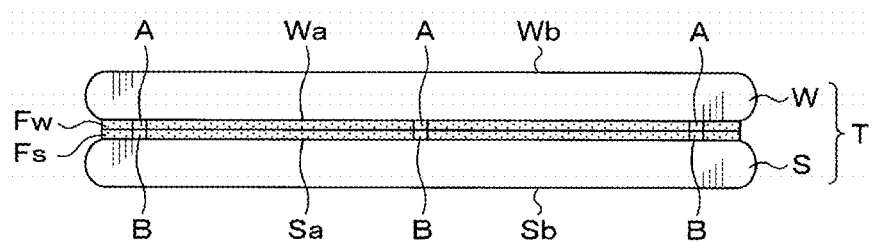
FIG. 1 is a side view schematically illustrating a structure of a combined wafer.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Recently, semiconductor devices are getting highly integrated. If a plurality of highly integrated semiconductor devices is placed on a horizontal plane and these semiconductor devices are connected by a wiring to be produced as a product, a length of the wiring is increased. As a result, there is a concern that resistance of the wiring is increased and a wiring delay is increased.

In this regard, there is proposed using a three-dimensional integration technique of stacking semiconductor devices three-dimensionally. In this three-dimensional integration technique, two sheets of semiconductor wafers (hereinafter, referred to as "wafers") are bonded to form a combined wafer. In the formation of this combined wafer, surfaces of the wafers to be bonded are modified by performing a plasma processing on the surfaces of the wafers, and the modified surfaces of the wafers are hydrophilized by supplying pure water onto the modified surfaces. Then, the hydrophilized surfaces of the wafers are bonded by a Van der Waals force and a hydrogen bond (intermolecular force).

FIG. 1 is a side view schematically illustrating a structure of a combined wafer T formed by bonding an upper wafer W and a lower wafer S. Hereinafter, in the upper wafer W, a surface to be bonded with the lower wafer S will be referred to as a front surface Wa, and a surface opposite from the front surface Wa will be referred to as a rear surface Wb. Likewise, in the lower wafer S, a surface to be bonded with the upper wafer W will be referred to as a front surface Sa, and a surface opposite from the front surface Sa will be referred to as a rear surface Sb.

The upper wafer Was a first substrate is a semiconductor wafer such as, but not limited to, a silicon wafer, and a device layer (not shown) including devices such as a plurality of electronic circuits is formed on the front surface Wa. Further, an oxide film Fw, for example, a transparent film such as a $SiO_2$ film (TEOS film) is formed on the device layer.

Further, a plurality of alignment marks A is formed on the oxide film Fw to adjust a horizontal position of the upper wafer W with respect to the lower wafer S when the upper wafer W and the lower wafer S are bonded with each other. The number and the arrangement of the alignment marks A is not limited to the shown example and can be selected as required.

The lower wafer S as a second substrate is a semiconductor wafer such as, but not limited to, a silicon wafer, and an oxide film Fs, for example, a $SiO_2$ (TEOS film) is formed on the front surface Sa. Further, the lower wafer S serves as a protection member configured to protect the device layer of the front surface Wa of the upper wafer W. Furthermore, in case that a plurality of devices is formed on the front surface Sa of the lower wafer S, a device layer (not shown) is formed on the front surface Sa, the same as in the upper wafer W.

Further, a plurality of alignment marks B is formed on the oxide film Fs to adjust a horizontal position of the lower wafer S with respect to the upper wafer W when the lower wafer S and the upper wafer W are bonded with each other. The number and the arrangement of the alignment marks B is not limited to the shown example and can be selected as required.

Moreover, when the upper wafer W and the lower wafer S are bonded, a surface of the oxide film Fw and a surface of the oxide film Fs are actually bonded. For the simplicity of explanation, however, the following description will be provided on the assumption that the front surface Wa of the upper wafer W and the front surface Sa of the lower wafer S are bonded.

When forming the aforementioned combined wafer T, position adjustment (alignment) between the upper wafer W and the lower wafer S in the horizontal direction is important. This alignment is achieved by imaging the alignment marks A and B with an imaging device (for example, a CCD camera) in sequence and allowing, based on obtained images, positions of the alignment marks A and the alignment marks B in the horizontal direction to coincide with each other.

In this alignment, when the alignment marks A and B are imaged, illumination light is irradiated to the front surface Wa of the upper wafer W and the front surface Sa of the lower wafer S. As an example of this illumination light, red light is generally used.

If, however, the imaging is performed by irradiating the red light to the front surfaces Wa and Sa, interference of the light may occur at the oxide films Fw and Fs (transparent films) formed on the front surfaces Wa and Sa of the wafers W and S, respectively. If such interference of the light takes place, a brightness or a contrast of the obtained image may vary largely, resulting in a failure to recognize the alignment marks A and B appropriately.

Figure 2:
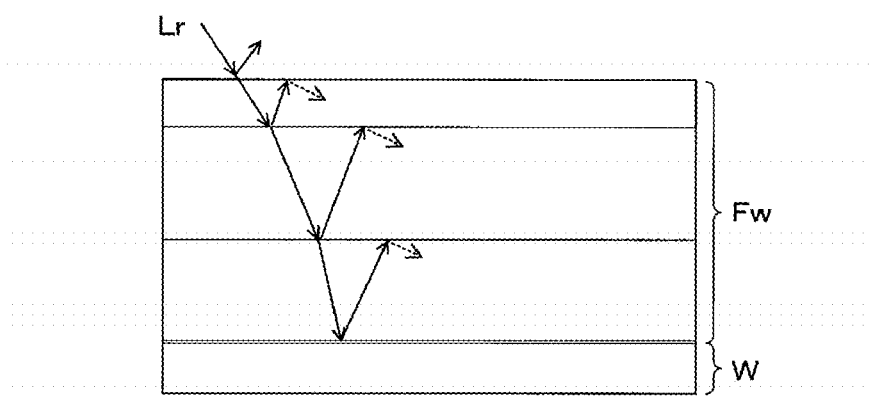
FIG. 2 is an explanatory diagram for describing interference of light.

The illumination light irradiated onto the upper wafer W are reflected and refracted on respective layers repeatedly, as shown in FIG. 2. If, however, a film thickness of the oxide film Fw formed on the upper wafer W, for example, is not uniform within the surface of the upper wafer W, reflectivity of the illumination light may not be uniform within the surface of the upper wafer W. In such a case, interference of the illumination light occurs at the oxide film Fw and the brightness or the contrast of the captured image varies, resulting in variations in recognized colors of the alignment marks A and B within the surface of the upper wafer W. If the recognized colors of the alignment marks A and B are changed, accuracy of position recognition of the alignment marks A and B is deteriorated. That is, there is a room for improvement in the alignment of the conventional bonding apparatus.

In view of the foregoing, the present inventor has conducted researches and found out that the accuracy of the position recognition can be improved by using white light having a wide-band wavelength as the illumination light for imaging the alignment mark. According to the disclosure of Patent Document 1, the white light is irradiated as the illumination light for the position adjustment of the upper wafer W in the horizontal direction in the exposure apparatus. However, Patent Document 1 does not mention anything about advantages of using the white light. Further, using the white light in the bonding apparatus, as practiced by the present inventor, has not been proposed conventionally.

According to the present disclosure, the position adjustment between the substrates is appropriately performed when the substrates are bonded. Hereinafter, a bonding apparatus according to the present exemplary embodiment will be described with reference to the accompanying drawings. Further, in the present specification and the various drawings, parts having substantially same functions will be assigned same reference numerals, and redundant description will be omitted.

Figure 3:
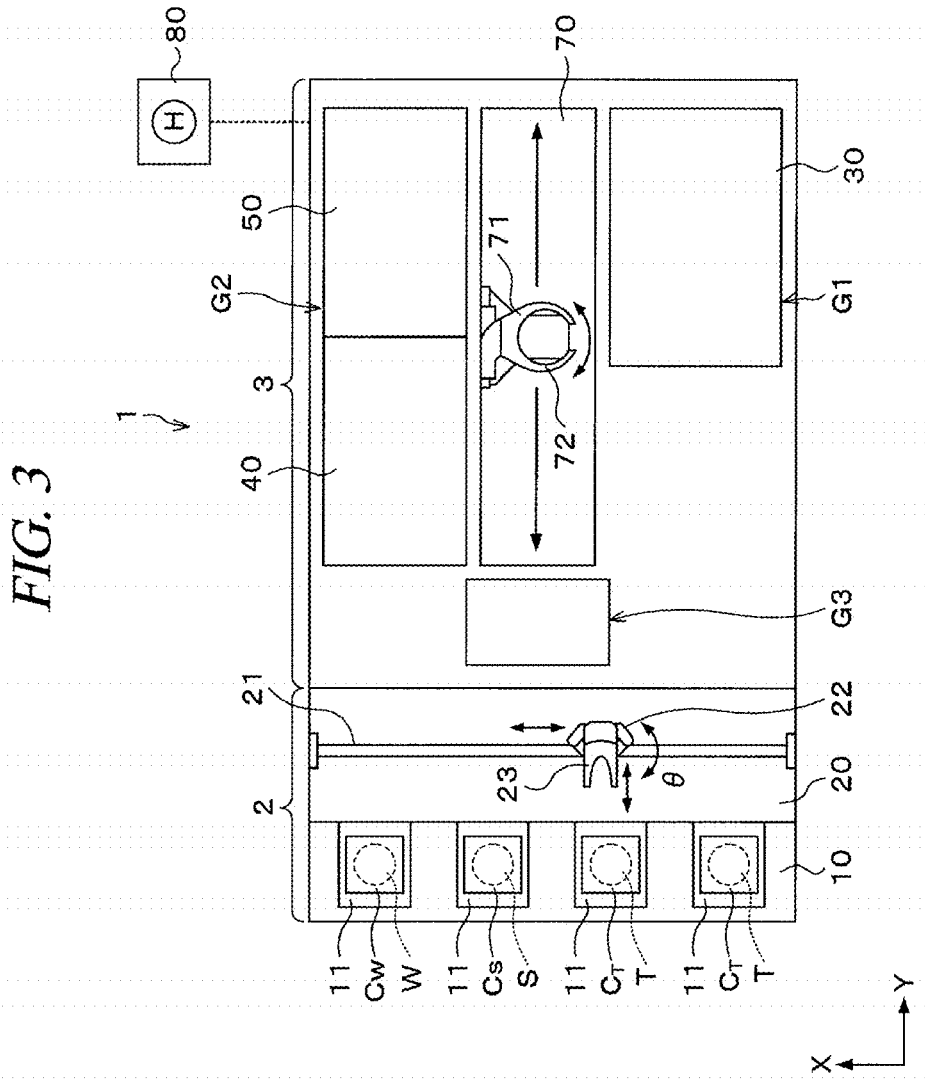
FIG. 3 is a plan view schematically illustrating a configuration of a bonding system.
Figure 4:
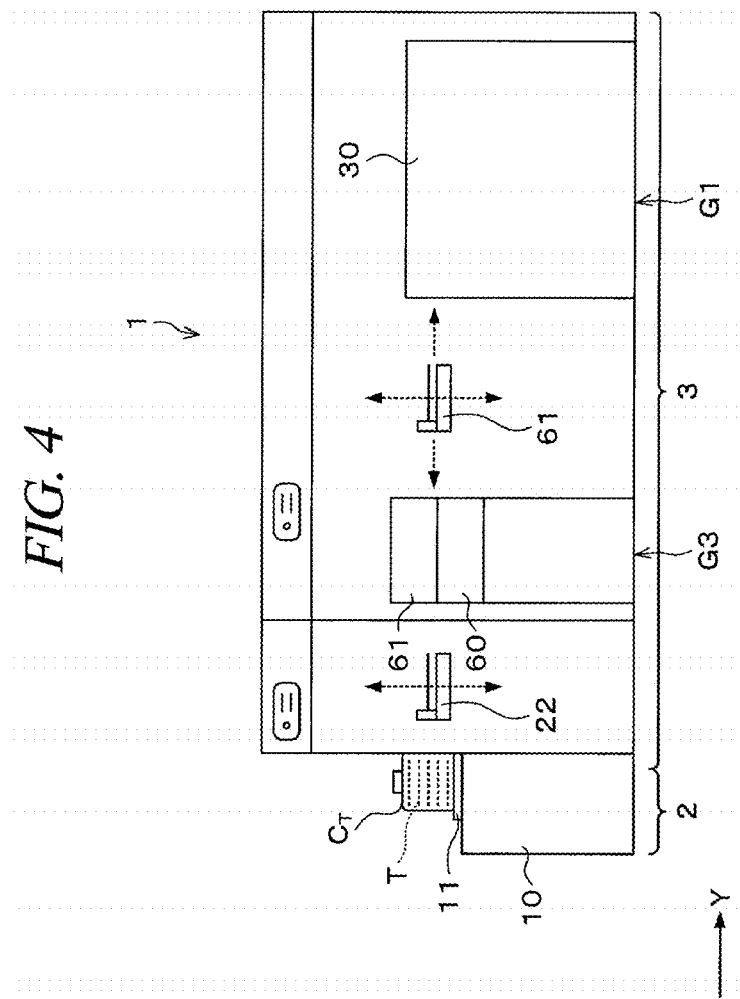
FIG. 4 is a side view schematically illustrating the configuration of the bonding system.

First, a configuration of a bonding system 1 equipped with the bonding apparatus according to the present exemplary embodiment will be explained. FIG. 3 and FIG. 4 are a plan view and a side view, respectively, schematically illustrating the configuration of the bonding system 1. In the following, in order to clarify positional relationships, the X-axis, Y-axis and Z-axis which are orthogonal to each other will be defined. The positive Z-axis direction will be regarded as a vertically upward direction.

As depicted in FIG. 3, the bonding system 1 is equipped with a carry-in/out station 2 and a processing station 3 connected as a single body. In the carry-in/out station 2, cassettes Cw, Cs and $C_T$ capable of accommodating therein a multiple number of upper wafers W, a multiple number of lower wafers S and a multiple number of combined wafers T, respectively, are carried to/from the outside, for example. The processing station 3 is equipped with various processing apparatus configured to perform processings on the upper wafers W and the lower wafers S.

The carry-in/out station 2 is equipped with a cassette placing table 10. In the shown example, a plurality of, for example, four cassettes Cw, Cs and $C_T$ can be placed on the cassette placing table 10 in a row in the X-axis direction. Further, the number of the cassettes Cw, Cs and $C_T$ placed on the cassette placing table 10 is not limited to the shown example in the present exemplary embodiment, and may be selected as required.

The carry-in/out station 2 is provided with a wafer transfer section 20 adjacent to the cassette placing table 10. Provided in the wafer transfer section 20 is a wafer transfer device 22 configured to be movable along a transfer path 21 which is elongated in the X-axis direction. The wafer transfer device 22 is equipped with a transfer arm 23 configured to hold and transfer the upper wafer W, the lower wafer S and the combined wafer T. The transfer arm 23 is configured to be movable in a horizontal direction and a vertical direction and pivotable around a horizontal axis and a vertical axis. Further, the number and the configuration of the transfer arm 23 are not limited to the example in the present exemplary embodiment, and may be selected as required. The wafer transfer device 22 is configured to transfer the upper wafer W, the lower wafer S and the combined wafer T to/from cassettes C on the cassette placing table 10 and transition devices 60 and 61 to be described later.

The processing station 3 is equipped with a plurality of, for example, three processing blocks G1 to G3 which are equipped with various kinds of processing apparatuses. By way of example, the first processing block G1 is provided at a front side (negative X-axis side in FIG. 3) of the processing station 3, and the second processing block G2 is provided at a rear side (positive X-axis side of FIG. 3) of the processing station 3. Further, the third processing block G3 is disposed at a carry-in/out station 2 side (negative Y-axis side of FIG. 3) of the processing station 3.

A surface modifying apparatus 30 is disposed in the first processing block G1. The surface modifying apparatus 30 is configured to modify the upper wafer W and the lower wafer S through a plasma processing. Further, the number and the layout of the surface modifying apparatus 30 are not limited to the shown example. By way of example, a multiple number of surface modifying apparatuses 30 may be arranged side by side in the Y-axis direction. Alternatively, a plurality of surface modifying apparatuses 30 may be stacked on top each other.

A surface hydrophilizing apparatus 40 and a bonding apparatus 50 are disposed in the second processing block G2. The surface hydrophilizing apparatus 40 is configured to hydrophilize the upper wafer W and the lower wafer S by supplying pure water thereto. The bonding apparatus 50 is configured to bond the upper wafer W and the lower wafer S which have been modified and hydrophilized.

The surface hydrophilizing apparatus 40 and the bonding apparatus 50 are arranged in the Y-axis direction in this sequence from carry-in/out station 2 side. Further, the number and the layout of the surface hydrophilizing apparatus 40 and the bonding apparatus 50 are not limited to the shown example. By way of example, the surface hydrophilizing apparatus 40 and the bonding apparatus 50 may be stacked on top of each other. A configuration of the bonding apparatus 50 will be elaborated later.

The transition devices 60 and 61 are disposed in the third processing block G3, as illustrated in FIG. 4. The transition devices 60 and 61 are stacked in sequence from the bottom.

As depicted in FIG. 3, a wafer transfer section 70 is formed in an area surrounded by the first processing block G1 to the third processing block G3. For example, a wafer transfer device 71 is disposed in the wafer transfer section 70.

The wafer transfer device 71 is equipped with a transfer arm 72 configured to hold and transfer the upper wafer W, the lower wafer S and the combined wafer T. The transfer arm 72 is configured to be movable in the horizontal direction and the vertical direction and pivotable around a horizontal axis and a vertical axis. Further, the number and the configuration of the transfer arm 72 are not limited to the shown example in the present exemplary embodiment, and may be selected as required. The wafer transfer device 71 is configured to transfer the upper wafer W, the lower wafer S and the combined wafer T into/from the various processing apparatuses within the first processing block G1, the second processing block G2 and the third processing block G3 nearby.

The above-described bonding system 1 is equipped with a control device 80. The control device 80 is implemented by, for example, a computer, and includes a program storage (not shown). The program storage stores therein programs for controlling various processings in the bonding system 1. Further, the program storage also stores therein programs for controlling operations of the above-described various processing apparatuses and a driving system such as the transfer devices to thereby allow a bonding processing to be described later to be performed in the bonding system 1. Further, the programs may be recorded on a computer-readable recording medium H and installed from the recording medium H to the control device 80.

Figure 5:
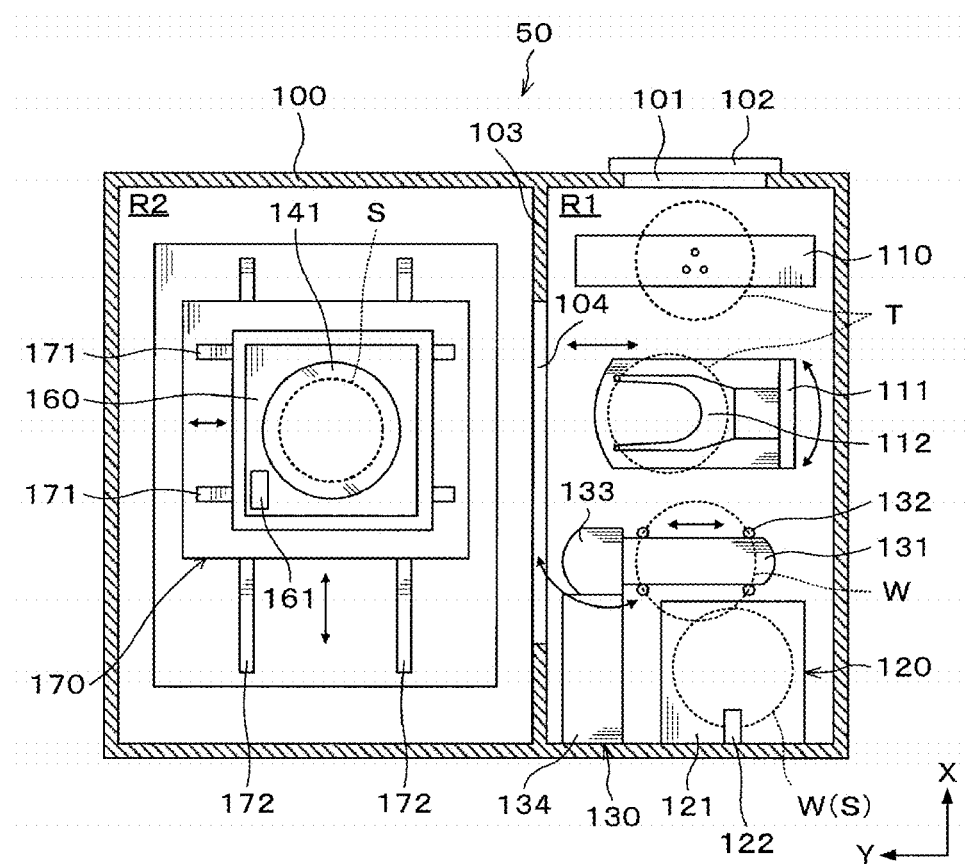
FIG. 5 is a plan view schematically illustrating a configuration of a bonding apparatus.
Figure 6:
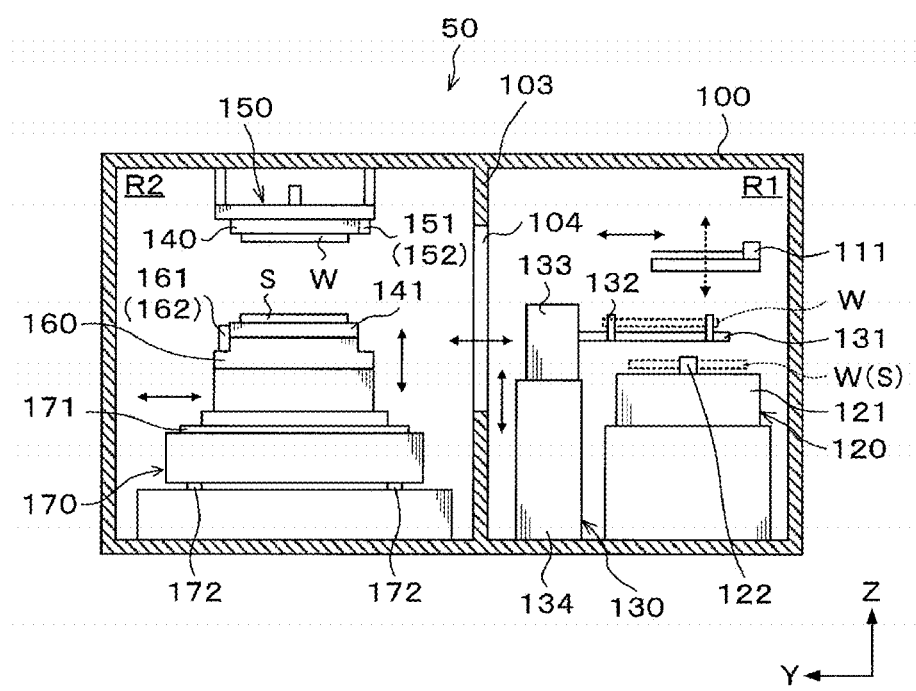
FIG. 6 is a front view schematically illustrating the configuration of the bonding apparatus.

Now, the configuration of the aforementioned bonding apparatus 50 will be explained. FIG. 5 and FIG. 6 are a plan view and a side view, respectively, schematically illustrating the configuration of the bonding apparatus 50.

The bonding apparatus 50 includes, as depicted in FIG. 5, a processing vessel 100 having a hermetically sealable inside. A carry-in/out opening 101 for the upper wafer W, the lower wafer S and the combined wafer T is formed at a lateral side of the processing vessel 100 near the wafer transfer section 70. An opening/closing shutter 102 is provided at the carry-in/out opening 101.

The inside of the processing vessel 100 is partitioned into a transfer region R1 and a processing region R2 by an inner wall 103. The aforementioned carry-in/out opening 101 is formed at the lateral side of the processing vessel 100 in the transfer region R1. Further, the inner wall 103 is also provided with a carry-in/out opening 104 for the upper wafer W, the lower wafer S and the combined wafer T.

A transition 110 for temporarily placing thereon the upper wafer W, the lower wafer S and the combined wafer T is provided at a positive X-axis side of the transfer region R1. The transition 110 is formed in, for example, two levels, and is capable of placing thereon any two of the upper wafer W, the lower wafer S and the combined wafer T at the same time.

A wafer transfer device 111 is provided in the transfer region R1. The wafer transfer device 111 is equipped with a transfer arm 112 configured to hold and transfer the upper wafer W, the lower wafer S and the combined wafer T. The transfer arm 112 is configured to be movable in the horizontal direction and the vertical direction and pivotable around a vertical axis. The wafer transfer device 111 is configured to transfer the upper wafer W, the lower wafer S and the combined wafer T within the transfer region R1 or between the transfer region R1 and the processing region R2.

A position adjusting device 120 configured to adjust a direction of the upper wafer W and the lower wafer S in the horizontal direction is provided at a negative X-axis side of the transfer region R1. The position adjusting device 120 detects positions of notches formed at the upper wafer W and the lower wafer S, and adjusts the positions of the notches by rotating the upper wafer W and the lower wafer S, thus adjusting the direction of the upper wafer W and the lower wafer S in the horizontal direction.

Furthermore, an inverting device 130 configured to invert the front surface and the rear surface of the upper wafer W is provided in the transfer region R1. The inverting device 130 is equipped with a holding arm 131 configured to hold and invert the upper wafer W. The holding arm 131 is configured to be movable in the horizontal direction and the vertical direction and pivotable around a horizontal axis and a vertical axis. Further, the inverting device 130 is configured to transfer the upper wafer W between the position adjusting device 120 and an upper chuck 140 to be described later.

As illustrated in FIG. 5 and FIG. 6, the upper chuck 140 serving as a first holder configured to attract and hold the upper wafer W on a bottom surface thereof and a lower chuck 141 serving as a second holder configured to attract and hold the lower wafer S on a top surface thereof are disposed in the processing region R2. The lower chuck 141 is provided under the upper chuck 140 and is disposed to face the upper chuck 140. That is, the upper wafer W held by the upper chuck 140 and the lower wafer S held by the lower chuck 141 can be arranged to face each other.

Figure 7:
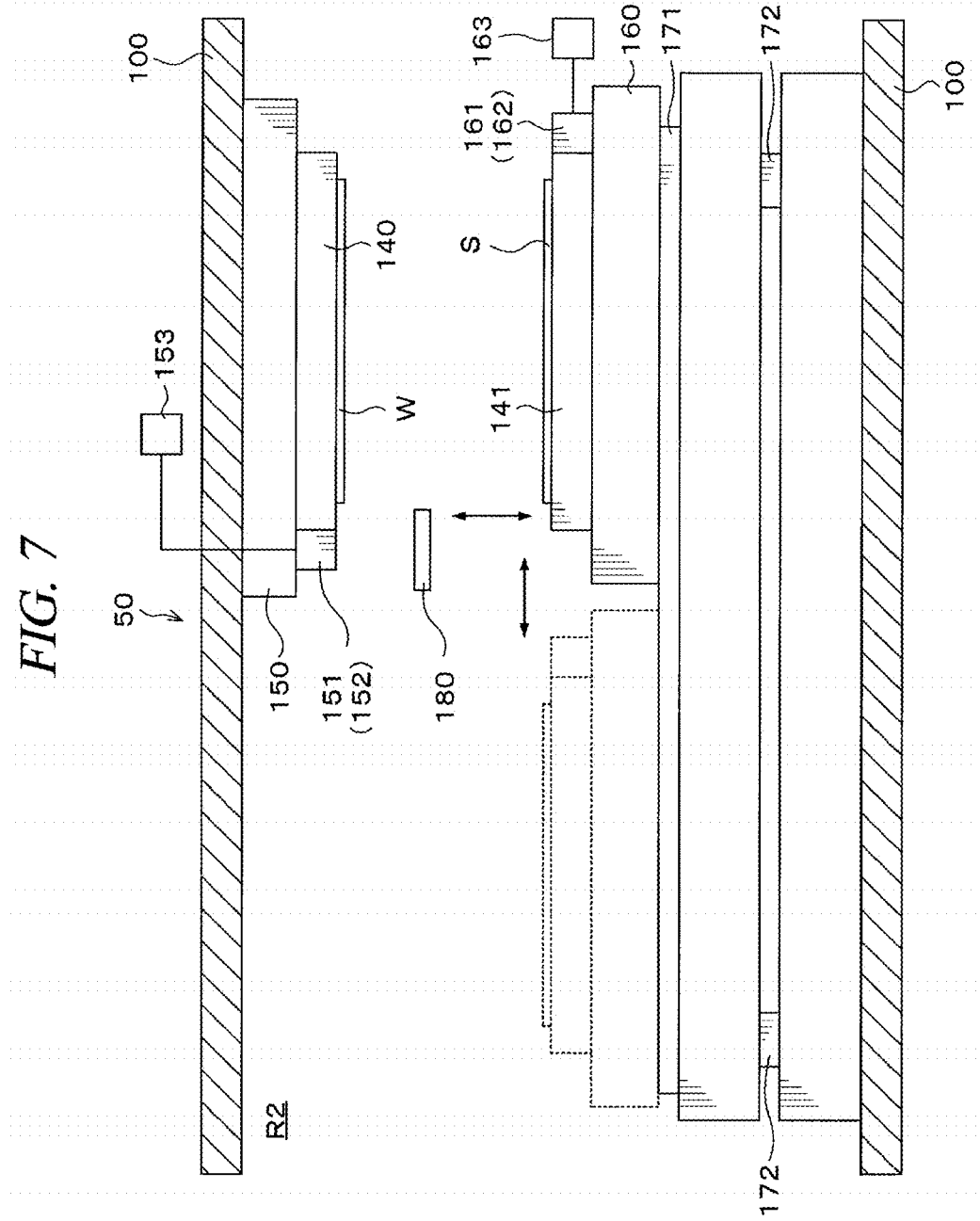
FIG. 7 is a side view schematically illustrating the configuration of the bonding apparatus.

FIG. 7 is a side view schematically illustrating an internal configuration of the processing region R2.

As shown in FIG. 6 and FIG. 7, the upper chuck 140 is supported by an upper chuck supporting member 150. The upper chuck supporting member 150 is provided at a ceiling surface of the processing vessel 100. That is, the upper chuck 140 is fixed to the ceiling surface of the processing vessel 100 with the upper chuck supporting member 150 therebetween.

The upper chuck supporting member 150 is equipped with an upper imaging device 151 serving as a first imaging device configured to image the front surface Sa of the lower wafer S held by the lower chuck 141; and an upper irradiating device 152 serving as a first light irradiating device configured to irradiate illumination light toward the lower wafer S when the upper imaging device 151 images the front surface Sa. The upper imaging device 151 and the upper irradiating device 152 are disposed adjacent to the upper chuck 140. Further, the number and the layout of the upper imaging device 151 and the upper irradiating device 152 are not limited to the shown example, and may be selected as required.

By way of non-limiting example, a CCD camera may be used as the upper imaging device 151.

An upper light source 153 serving as a first light source is connected to the upper irradiating device 152, as shown in FIG. 7. White light (for example, white LED) is selected as the light irradiated to the front surface Sa of the lower wafer S.

As depicted in FIG. 6 and FIG. 7, the lower chuck 141 is supported by a lower chuck supporting member 160. The lower chuck supporting member 160 is connected to a moving device 170 and configured to move the lower chuck 141 in the horizontal direction and the vertical direction and rotate the lower chuck 141 around a vertical axis.

The lower chuck supporting member 160 is equipped with a lower imaging device 161 serving as a second imaging device configured to image the front surface Wa of the upper wafer W held by the upper chuck 140; and a lower irradiating device 162 serving as a second light irradiating device configured to irradiate illumination light toward the upper wafer W when the lower imaging device 161 images the front surface Wa. The lower imaging device 161 and the lower irradiating device 162 are disposed adjacent to the lower chuck 141. Further, the number and the layout of the lower imaging device 161 and the lower irradiating device 162 are not limited to the shown example, and may be selected as required.

By way of example, but not limitation, a CCD camera may be used as the lower imaging device 161.

A lower light source 163 serving as the first light source is connected to the lower irradiating device 162, as shown in FIG. 7. The white light (for example, white LED) is selected as the light irradiated to the front surface Wa of the upper wafer W.

Further, the upper light source 153 and the lower light source 163 may be provided independently for the upper irradiating device 152 and the lower irradiating device 162, respectively, as shown in FIG. 7, or a common light source may be connected to the upper irradiating device 152 and the lower irradiating device 162.

The moving device 170 is fastened to a pair of rails 171 which is provided at a bottom side of the lower chuck supporting member 160 and elongated in the Y-axis direction. The lower chuck supporting member 160 is configured to be moved in the Y-axis direction along the rails 171.

Further, the moving device 170 is equipped with a pair of rails 172 elongated in the X-axis direction. The lower chuck supporting member 160 is configured to be moved in the X-axis direction along the rails 172.

Furthermore, a target 180 for performing the position adjustment between the upper imaging device 151 and the lower imaging device 161 in the horizontal direction is provided in the processing region R2. The target 180 is disposed between the upper imaging device 151 and the lower imaging device 161 when the position adjustment between the upper imaging device 151 and the lower imaging device 161 is performed.

Figure 8:
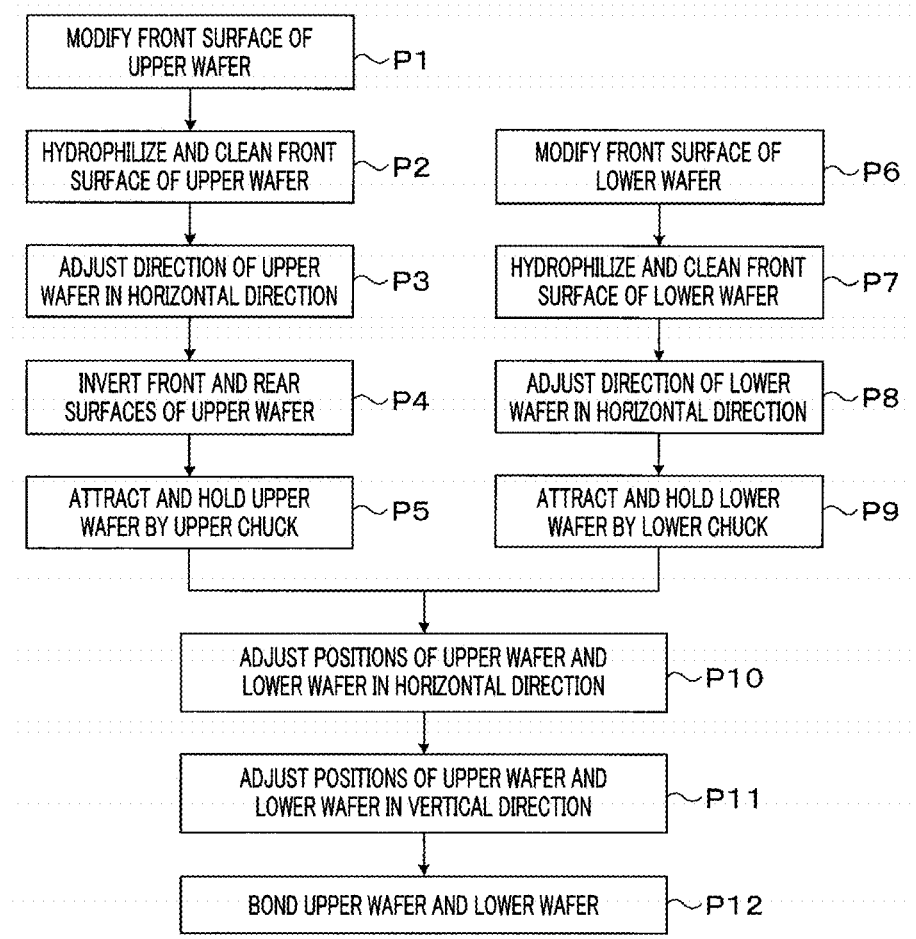
FIG. 8 is a flowchart illustrating major processes of a bonding processing.

The bonding apparatus 50 according to the present exemplary embodiment is configured as described above. Now, a bonding processing for wafers performed by using the bonding system 1 equipped with the bonding apparatus 50 will be described. FIG. 8 is a flowchart illustrating major processes of the bonding processing.

First, the cassette Cw accommodating the multiple number of upper wafers W, the cassette Cs accommodating the multiple number of lower wafers S and an empty cassette $C_T$ are placed on the preset cassette placing plates 11 of the carry-in/out station 2. Then, the upper wafer W is taken out of the cassette Cw by the wafer transfer device 22 to be transferred into the transition device 60 of the third processing block G3.

Subsequently, the upper wafer W is transferred into the surface modifying apparatus 30 of the first processing block G1 by the wafer transfer device 71. In the surface modifying apparatus 30, an oxygen gas and a nitrogen gas as a processing gas is excited into plasma to be ionized in a decompressed atmosphere. These oxygen ions and nitrogen ions are irradiated to the front surface Wa of the upper wafer W, and the front surface Wa is plasma-processed. As a result, the front surface Wa of the upper wafer W is modified (process P1 of FIG. 8).

The upper wafer W having the modified front surface Wa is then transferred into the surface hydrophilizing apparatus 40 of the second processing block G2 by the wafer transfer device 71. In the surface hydrophilizing apparatus 40, the pure water is supplied onto the upper wafer W while rotating the upper wafer W held by the spin chuck. Accordingly, the supplied pure water is diffused on the front surface Wa of the upper wafer W, and hydroxyl groups (silanol groups) adhere to the front surface Wa modified in the surface modifying apparatus 30, so that the front surface Wa is hydrophilized. Further, the upper wafer W is cleaned by the pure water (process P2 of FIG. 8).

Thereafter, the upper wafer W is transferred into the bonding apparatus 50 of the second processing block G2 by the wafer transfer device 71. The upper wafer W carried into the bonding apparatus 50 is then transferred into the position adjusting device 120 via the transition 110 by the wafer transfer device 111. The direction of the upper wafer W in the horizontal direction is adjusted by the position adjusting device 120 (process P3 of FIG. 8).

Thereafter, the upper wafer W having the adjusted direction is delivered onto the holding arm 131 of the inverting device 130. Then, in the transfer region R1, by inverting the holding arm 131 around the horizontal axis, the front surface and the rear surface of the upper wafer W are inverted (process P4 of FIG. 8). That is, the front surface Wa of the upper wafer W is turned to face downwards.

Subsequently, the holding arm 131 is rotated around the vertical axis to be located under the upper chuck 140 in the processing region R2. The rear surface Wb of the upper wafer W is attracted to and held by the upper chuck 140 (process P5 of FIG. 8).

While the above-described processes P1 to P5 are being performed on the upper wafer W, a processing of the lower wafer S is performed, following the upper wafer W.

First, the lower wafer S is taken out from the cassette Cs by the wafer transfer device 22 to be transferred into the transition device 60 of the processing station 3.

Subsequently, the lower wafer S is transferred into the surface modifying apparatus 30 by the wafer transfer device 71, and the front surface Sa thereof is modified (process P6 of FIG. 8). Further, the modification of the front surface Sa of the lower wafer S in the process P6 is performed in the same way as in the above-described process P1.

The lower wafer S having the modified front surface Sa is then transferred into the surface hydrophilizing apparatus 40 by the wafer transfer device 71, and the front surface Sa is hydrophilized and cleaned (process P7 of FIG. 8). The hydrophilizing and the cleaning of the front surface Sa of the lower wafer S in the process P7 are performed in the same way as in the above-described process P2.

Thereafter, the lower wafer S is transferred into the bonding apparatus 50 by the wafer transfer device 71. The lower wafer S carried into the bonding apparatus 50 is transferred into the position adjusting device 120 via the transition 110 by the wafer transfer device 111. Then, the direction of the lower wafer S in the horizontal direction is adjusted by the position adjusting device 120 (process P8 of FIG. 8).

The lower wafer S having the adjusted direction is then transferred to be located above the lower chuck 141 in the processing region R2 by the wafer transfer device 111. Then, the rear surface Sb of the lower wafer S is attracted to and held by the lower chuck 141 (process P9 of FIG. 8).

If the upper wafer W and the lower wafer S are attracted to and held by the upper chuck 140 and the lower chuck 141, respectively, an alignment processing on the upper wafer W and the lower wafer S in the horizontal direction is then performed (process P10 of FIG. 8).

FIG. 9A to FIG. 9D are explanatory diagrams schematically illustrating an alignment processing in the bonding apparatus 50.

Figure 9A:
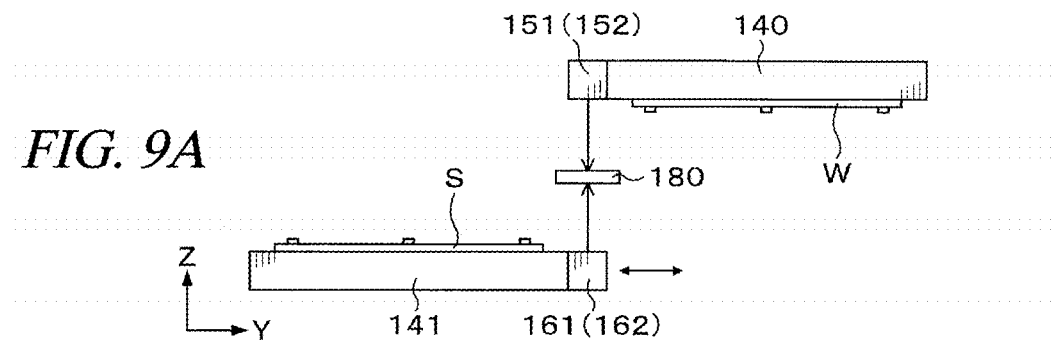
FIG. 9A to FIG. 9D are explanatory diagrams illustrating main operations of an alignment processing in the bonding apparatus.

In the alignment processing in the bonding apparatus 50, adjustment of positions of the upper imaging device 151 and the lower imaging device 161 in the horizontal direction is first performed, as shown in FIG. 9A. To elaborate, the lower chuck supporting member 160 is moved in the horizontal direction to locate the lower imaging device 161 under the upper imaging device 151. Then, the common target 180 is checked by the upper imaging device 151 and the lower imaging device 161, and the lower chuck supporting member 160 is moved to allow the positions of the upper imaging device 151 and the lower imaging device 161 in the horizontal direction to be coincident. At this time, since the upper imaging device 151 is fixed at the processing vessel 100, only the lower imaging device 161 needs to be moved, whereby the positions of the upper imaging device 151 and the lower imaging device 161 in the horizontal direction can be appropriately adjusted.

Figure 9B:
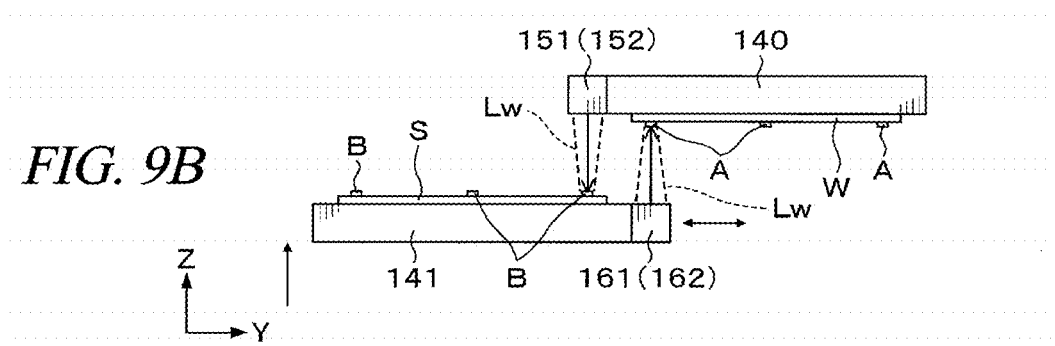
Figure 9C:
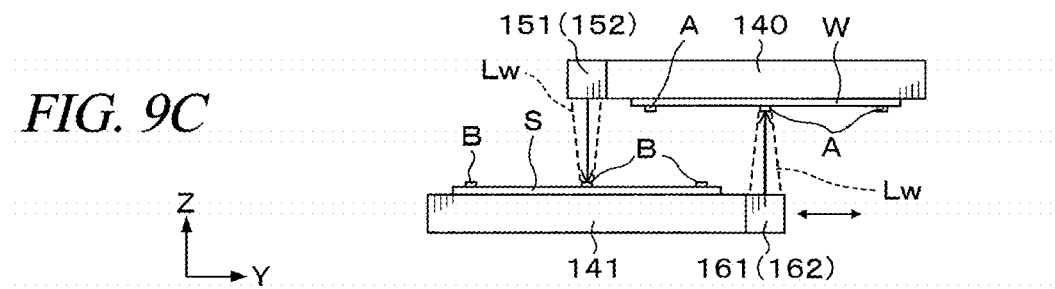

Subsequently, as illustrated in FIG. 9B and FIG. 9C, by moving the lower chuck supporting member 160 in the horizontal direction, the plurality of alignment marks A formed on the upper wafer W are imaged in sequence by the lower imaging device 161. Concurrently, the plurality of alignment marks B formed on the lower wafer S are imaged in sequence by the upper imaging device 151.

Further, when imaging the alignment marks A and B by using the upper imaging device 151 and the lower imaging device 161, the illumination light is irradiated toward the alignment marks A and the alignment marks B from the upper irradiating device 152 and the lower irradiating device 162, respectively. As an example of the illumination light, white light Lw is used.

Figure 9D:
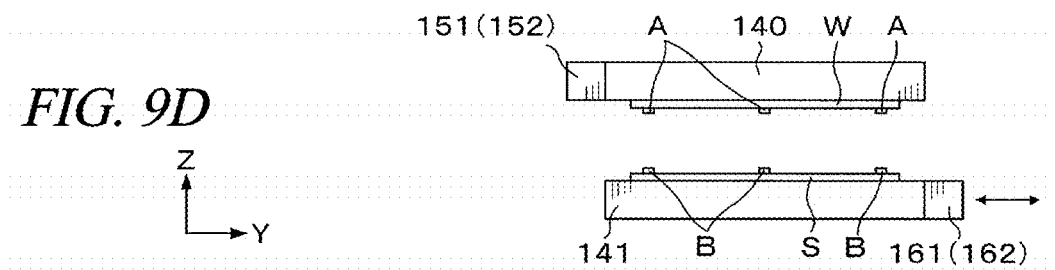

Images obtained by the upper imaging device 151 and the lower imaging device 161 are outputted to the control device 80. Based on the images obtained by the upper imaging device 151 and the lower imaging device 161, the control device 80 moves the lower chuck 141 to a position where the alignment marks A of the upper wafer W and the alignment marks B of the lower wafer S are respectively aligned, as shown in FIG. 9D.

Upon the completion of the alignment processing between the upper wafer W and the lower wafer S, positions of the upper chuck 140 and the lower chuck 141 in the vertical direction are adjusted by moving the lower chuck supporting member 160 in the vertical direction. Accordingly, positions of the upper wafer W held by the upper chuck 140 and the lower wafer S held by the lower chuck 141 in the vertical direction are adjusted (process P11 of FIG. 8). At this time, a distance between the front surface Sa of the lower wafer S and the front surface Wa of the upper wafer W is set to be in a range from, e.g., 50 μm to 200 μm.

Afterwards, the bonding processing of bonding the upper wafer W and the lower wafer S is performed (process P12 of FIG. 8). The bonding processing is begun as a center of the upper wafer W is pressed to be in contact with a center of the lower wafer S in the state that the upper wafer W and the wafer S are held by the upper chuck 140 and the lower chuck 141, respectively. To elaborate, since the front surface Wa of the upper wafer W and the front surface Sa of the lower wafer S have been modified in the process P1 and the process P6, respectively, a Van der Waals force is generated, so that the front surface Wa of the upper wafer W and the front surface Sa of the lower wafer S are bonded. Further, since the front surface Wa of the upper wafer W and the front surface Sa of the lower wafer S have been hydrophilized in the processes P2 and P7, respectively, hydrophilic groups between the front surfaces Wa and Sa are hydrogen-bonded so that the front surfaces Wa and Sa are more firmly bonded If the bonding is begun as the centers of the upper wafer W and the lower wafer S are pressed into contact with each other, the bonding by the Van der Waals force and the hydrogen-bond is expanded from the centers of the wafers W and S toward peripheries thereof. If the entire front surface Wa of the upper wafer W and the entire front surface Sa of the lower wafer S are brought into contact with each other, the bonding of the upper wafer W and the lower wafer S is completed, so that the combined wafer T is formed.

The combined wafer T is transferred into the transition device 61 by the wafer transfer device 71, and is then carried into the cassette $C_T$ on the cassette placing plate 11 by the wafer transfer device 22 of the carry-in/out station 2. Through these processes, the series of operations of the bonding processing in the bonding system 1 are completed.

In the bonding apparatus 50 according to the above-described exemplary embodiment, the white light Lw as the illumination light is irradiated toward the upper wafer W and the lower wafer S when the alignment marks A and B are imaged to perform the alignment between the upper wafer W and the lower wafer S.

Here, in case that a transparent film, for example, a $SiO_2$ film (TEOS film) as the oxide film Fw is formed on the front surface Wa of the upper wafer W or the front surface Sa of the lower wafer S as shown in FIG. 1, there is a concern that the interference of the light may occur as shown in FIG. 2 and the positions of the alignment marks A and B may not be appropriately recognized.

Figures 10A, 10B, 10C:
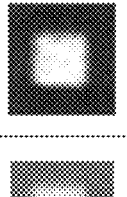
FIG. 10A to FIG. 10C are explanatory diagrams illustrating imaging results of alignment marks.
Figure 12:
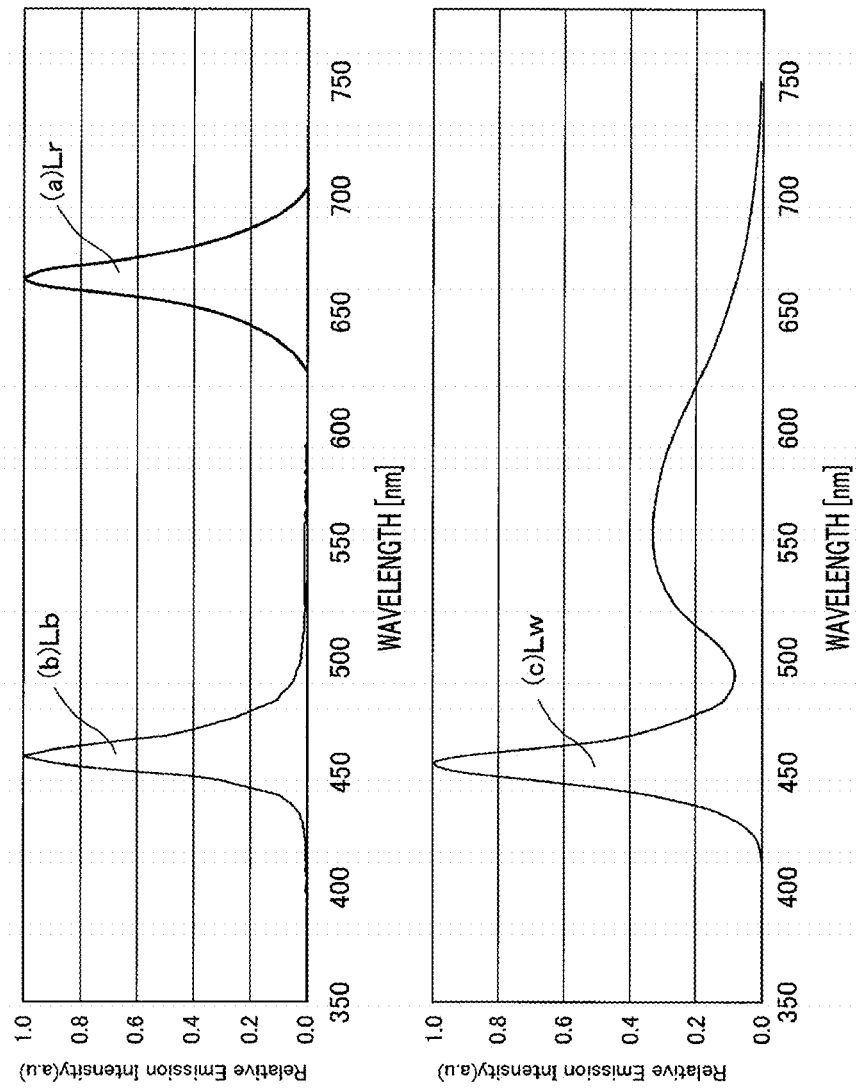
FIG. 12 is an explanatory diagram illustrating wavelength bands of irradiated lights.

FIG. 10A to FIG. 10C illustrate example images obtained by imaging the alignment mark A with illumination lights having different wavelength bands. The alignment mark A is imaged by using red light Lr (FIG. 10A), blue light Lb (FIG. 10B), and white light Lw (FIG. 10C) as the illumination lights having the different wavelength bands, as shown in FIG. 12. To elaborate, the red light Lr has a wavelength of about 660 nm; the blue light Lb, a wavelength of about 465 nm; and the white light Lw, a wavelength band ranging from about 430 nm to about 700 nm.

As shown in FIG. 10A, in case that the alignment mark A is imaged by irradiating the red light Lr thereto, the alignment mark A is recognized as being white and an outside thereof is recognized as being black in, for example, No. 1, whereas, in No. 7, the contrast is reversed so that the alignment mark A is recognized as being black and the outside thereof is recognized as being white. Further, as compared to, for example, No. 7 where a contrast ratio between the alignment mark A and the outside thereof is large and a boundary of the alignment mark A is clear, a contrast ratio is small and a boundary of the alignment mark A is not clear in No. 5. Furthermore, on each recognized alignment mark A, a contrast ratio in a perimeter direction (at four sides of a square) may not be uniform, as shown in No. 6.

As depicted in FIG. 10B, in case that the alignment mark A is imaged by irradiating the blue light Lb thereto, the alignment mark A is recognized as being white and an outside thereof is recognized as being black in, for example, No. 1, whereas, in No. 2, the contrast is reversed so that the alignment mark A is recognized as being black and the outside thereof is recognized as being white, the same as the imaging result by the red light Lr. Further, as compared to, for example, No. 6 where the contrast ratio is large and the boundary of the alignment mark A is clear, the contrast ratio is small and the boundary of the alignment mark A is not clear in No. 7. Furthermore, on each recognized alignment mark A, the contrast ratio in the perimeter direction may not be uniform.

As described above, if the red light Lr or the blue light Lb is used as the illumination light in performing the alignment, the imaging results by the upper imaging device 151 and the lower imaging device 161 may not be uniform. If such non-uniformity in the imaging results occurs, the accuracy of the position recognition of the alignment mark A may be deteriorated, resulting in an alignment error.

Figure 11:
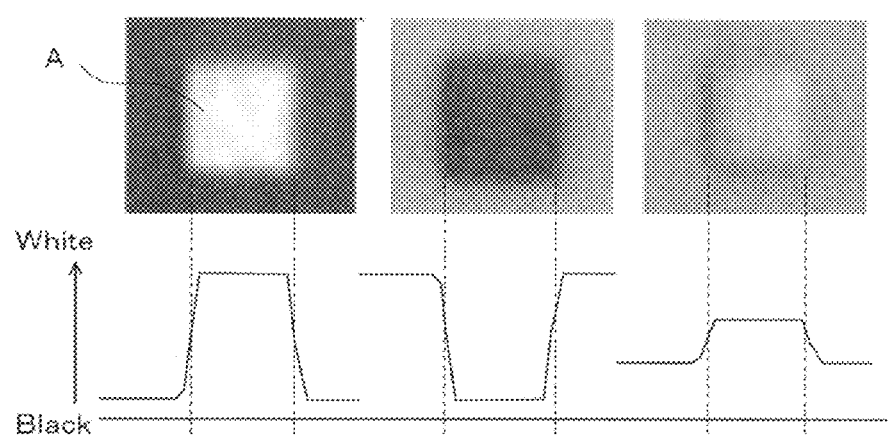
FIG. 11 is an explanatory diagram illustrating a method of analyzing the imaging results.

FIG. 11 is an explanatory diagram illustrating an example processing method of recognizing the position of the alignment mark A based on the obtained image data. The recognition of the position of the alignment mark A is carried out by recognizing a boundary of the imaged alignment mark A. The boundary of the alignment mark A is recognized by creating a graph of the contrast of the obtained image data, as shown in FIG. 11.

To elaborate, as illustrated on a graph of FIG. 11, a degree of blackness and a degree of whiteness in the obtained images are respectively converted into numerical values and graphed on a vertical axis. Through differentiation thereof, a maximum value is calculated, and a position indicating the maximum value is determined to be the boundary of the alignment mark A.

Here, as shown in FIG. 10A and FIG. 10B, if the contrast of the imaged alignment mark A is reversed, a plus and a minus of the calculated maximum value is reversed. As a result, the boundary may not be appropriately recognized. Further, if the contrast ratio at the boundary of the imaged alignment mark A is small, a difference between the degree of blackness and the degree of whiteness which are converted into the numeral values is reduced, so that the boundary may not be appropriately recognized.

As stated above, if there is non-uniformity in the imaging results of the alignment mark A, the accuracy of the position recognition of the alignment mark A may become non-uniform, and, as a result, the alignment between the upper wafer W and the lower wafer S may not be appropriately carried out.

Meanwhile, in case that the alignment mark A is imaged by using the white light Lw, as shown in FIG. 10C, the brightness of the recognized alignment marks A and the contrast thereof are found to be uniform, that is, stabilized. If the accuracy of the position recognition becomes uniform, the accuracy of position recognition of the upper wafer W and the lower wafer S are stabilized in the entire surfaces thereof, so that the alignment between the upper wafer W and the lower wafer S can be appropriately carried out.

It is deemed to be because, as shown in FIG. 12, an influence of the interference of the light at the transparent film can be uniformed as the white light Lw has a wide wavelength band (a plurality of wavelength bands). To be specific, even if the interference of the light takes place in a wavelength band of a red light Lr component belonging to the white light Lw, the boundary of the alignment mark A can be appropriately recognized by light of another band (for example, a wavelength band of a blue light Lb component). Thus, it is deemed that a uniform imaging result can be obtained regardless of the influence of the interference of the light at some wavelength bands.

As stated above, by irradiating the white light Lw to the upper wafer W and the lower wafer S, the stable imaging results can be obtained, and the alignment can be appropriately carried out regardless of the influence of the interference of the light at the transparent film. Accordingly, the bonding of the upper wafer W and the lower wafer S can be performed appropriately.

Further, according to the above-described exemplary embodiment, the white light Lw is irradiated by using the white LED as the first light source. However, the way how to irradiate the white light Lw is not limited thereto. By way of non-limiting example, by emitting lights of a plurality of colors (for example, red, green and blue) all at once, an illumination having a wavelength of a wide band as illustrated in FIG. 12 is obtained, so that the white light Lw can be synthesized.

Furthermore, if the white light Lw is used, though the uniform imaging results can be obtained by uniforming the influence of the interference of the light, a resolution of the obtained images (the contrast ratio at the boundary of the alignment mark A) is reduced, as compared to the case where the imaging is performed by using the red light Lr or the blue light Lb. That is, the boundary of the alignment mark A is uniformly faintly imaged, as illustrated in FIG. 10A to FIG. 10C.

When the imaging is performed by using the white light Lw, however, since the resolution is uniformly reduced at the entire perimeter (four sides of the square) of the alignment mark A, the non-uniformity in the accuracy of the position recognition in the perimeter direction of the alignment mark A is not caused. That is, the accuracy of the alignment is not deteriorated.

Moreover, in the above-described exemplary embodiment, the upper irradiating device 152 and the lower irradiating device 162 are connected to the upper light source 153 and the lower light source 163 configured to irradiate the white light Lw, respectively. However, the number of the light sources connected to the upper irradiating device 152 and the lower irradiating device 162 is not limited thereto.

Figure 13:
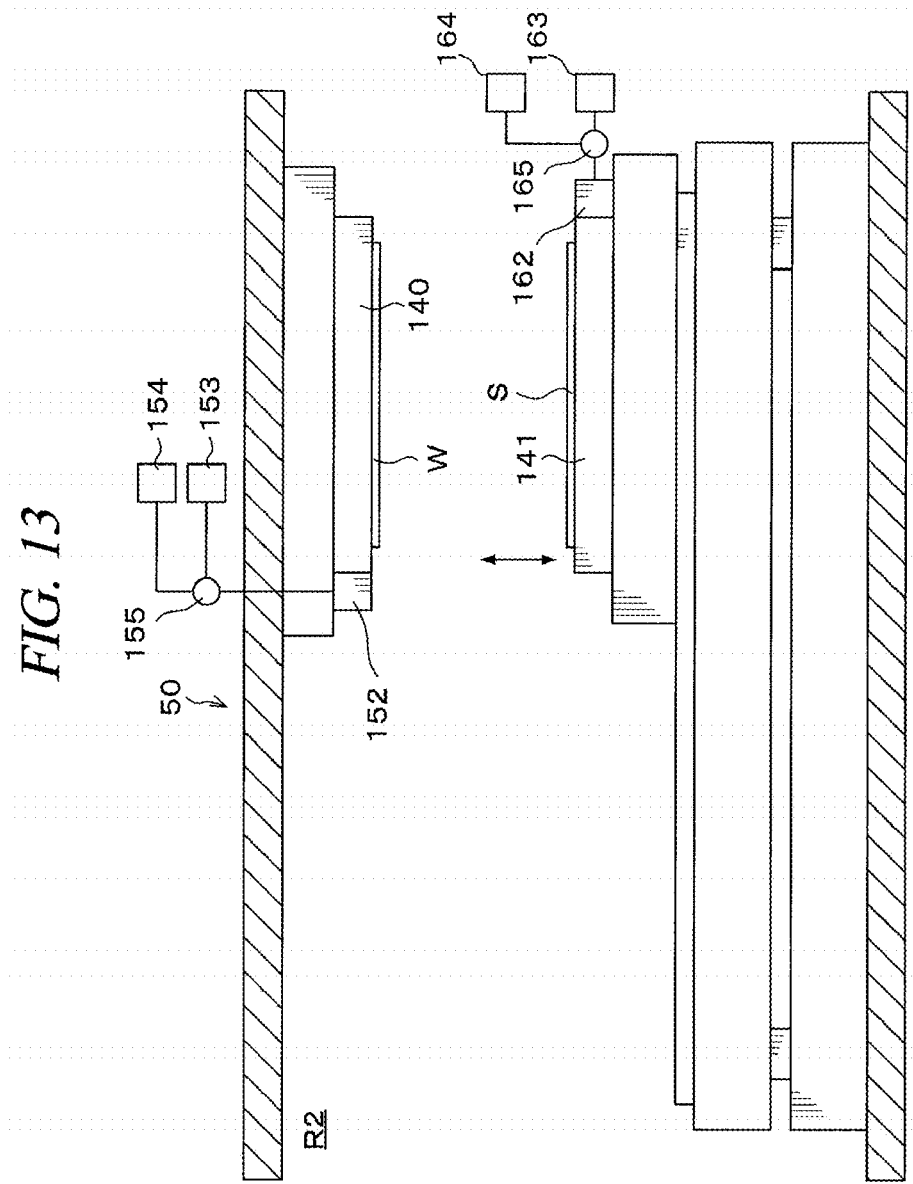
FIG. 13 is a side view schematically illustrating another configuration of the bonding apparatus.

By way of example, as depicted in FIG. 13, an upper light source 154 as a second light source and a lower light source 164 as the second light source configured to irradiate light (for example, the red light Lr) other than the white light may be further connected to the upper light source 153 and the lower light source 163, respectively. In such a case, it is desirable that the upper light sources 153 and 154 and the lower light sources 163 and 164 are configured to switch the light to be irradiated by using optical path switching devices 155 and 165, respectively.

As stated above, when the imaging of the alignment mark A is performed by irradiating the red light Lr or the blue light Lb, imaging results (for example, the brightness and the contrast ratio) may not become uniform, whereas the resolution of the obtained images may be improved as compared to the case where the imaging is performed by using the white light Lw. In case that the imaging data can be obtained with such high resolution, the boundary of the alignment mark A can be more appropriately recognized. That is, the accuracy of the alignment can be bettered.

Thus, by connecting the plurality of light sources to the upper light source 153 and the lower light source 163 as depicted in FIG. 13, the light to be irradiated can be changed based on surface states (for example, a thickness of the transparent film or in-surface uniformity thereof) of the upper wafer W and the lower wafer S.

Specifically, the alignment may be normally performed by irradiating the red light Lr, and if a required level of the accuracy of the position recognition cannot be obtained, the white light Lw may be irradiated. Further, for example, the alignment may be normally performed by irradiating the white light Lw, and the red light Lr may be irradiated when a higher level of the accuracy of the alignment is required.

Besides, the in-surface uniformity of the transparent film formed on each of the upper wafer W and the lower wafer S carried into the bonding apparatus 50 may be previously measured, and the irradiation of the red light Lr and the irradiation of the white light Lw may be switched based on the measured in-surface uniformity.

In addition, if the transparent film causing the interference of the light is formed on the upper wafer W or the lower wafer S, the white light Lw may be irradiated, and when such a transparent film is not formed thereon, the red light Lr may be irradiated.

Further, the upper light source 153 and the lower light source 163 may be provided independently for the upper irradiating device 152 and the lower irradiating device 162, respectively, as shown in FIG. 7, or a common light source may be connected to the upper irradiating device 152 and the lower irradiating device 162.

Furthermore, the number of the light sources connected to the upper irradiating device 152 and the lower irradiating device 162 is not limited to the above-described example, and a multiple number of light sources may be connected thereto, respectively.

Additionally, in case of synthesizing the white light Lw through the simultaneous emission of the lights of the different colors as described above, the upper light source 153 as the first light source configured to irradiate the white light and the upper light source 154 as the second light source configured to irradiate the light other than the white light may be used together. Likewise, the lower light source 163 as the first light source and the lower light source 164 as the second light source may be used together.

It will be appreciated that the various exemplary embodiments of the present disclosure are not intended to be limiting, and that various modifications may be made therefrom. Further, the above-described exemplary embodiments may be omitted, substituted or changed in various ways without departing from the scope and spirit of the following claims.

By way of example, the technical contents of the present disclosure is applied to the bonding apparatus in the above-described exemplary embodiments. However, the technical contents of the present disclosure may be applicable of another apparatus, for example, a film forming apparatus as long as the apparatus needs alignment.

Further, the followings also belong to the technical scope of the present disclosure.

(1) A bonding apparatus configured to bond a first substrate and a second substrate, comprising:

a first holder configured to hold the first substrate;

a second holder configured to hold the second substrate;

a first imaging device provided at the first holder and configured to image the second substrate held by the second holder;

a first light irradiating device provided at the first holder and configured to irradiate light to the second substrate when the second substrate is imaged by the first imaging device;

a second imaging device provided at the second holder and configured to image the first substrate held by the first holder; and a second light irradiating device provided at the second holder and configured to irradiate light to the first substrate when the first substrate is imaged by the second imaging device, wherein each of the first light irradiating device and the second light irradiating device is connected to a first light source configured to irradiate white light.

According to (1), as the imaging is performed by irradiating the white light to the substrate, the accuracy of the position recognition of the alignment mark formed on the substrate can be improved.

(2) The bonding apparatus as described in (1), wherein each of the first light irradiating device and the second light irradiating device is further connected to a second light source configured to irradiate light other than the white light, and the first light irradiating device and the second light irradiating device are allowed to switch irradiation of the light from the first light source and irradiation of the light from the second light source.

According to (2), since the light to be irradiated can be switched based on the state of the transparent film formed on the substrate, the accuracy of the position recognition of the alignment mark formed on the substrate can be further improved.

(3) A bonding method of bonding substrates, comprising: performing a position adjustment between a first substrate and a second substrate; and bonding the first substrate and the second substrate, wherein the performing of the position adjustment comprises:

imaging the second substrate to which light is irradiated by a first light irradiating device; and imaging the first substrate to which light is irradiated by a second light irradiating device, and wherein the light irradiated from each of the first light irradiating device and the second light irradiating device is white light irradiated from a first light source.

(4) The bonding method as described in (3), wherein each of the first light irradiating device and the second light irradiating device is further connected to a second light source configured to irradiate light other than the white light, and the first light irradiating device and the second light irradiating device are allowed to switch irradiation of the light from the first light source and irradiation of the light from the second light source.

(5) The bonding method as described in (4), wherein the first light irradiating device is configured to irradiate the light from the first light source when a transparent film is formed on the second substrate, and the first light irradiating device is configured to irradiate the light from the second light source when the transparent film is not formed on the second substrate.

(6) The bonding method as described in (4) or (5), wherein the second light irradiating device is configured to irradiate the light from the first light source when a transparent film is formed on the first substrate, and the second light irradiating device is configured to irradiate the light from the second light source when the transparent film is not formed on the first substrate.

According to the exemplary embodiment, it is possible to carry out position adjustment between the substrates appropriately.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A bonding apparatus configured to bond a first substrate and a second substrate, comprising:
    a first holder configured to hold the first substrate;
    a second holder configured to hold the second substrate;
    a first imaging device provided at the first holder and configured to image the second substrate held by the second holder;
    a first light irradiating device provided at the first holder and configured to irradiate light to the second substrate when the second substrate is imaged by the first imaging device;
    a second imaging device provided at the second holder and configured to image the first substrate held by the first holder; and
    a second light irradiating device provided at the second holder and configured to irradiate light to the first substrate when the first substrate is imaged by the second imaging device,
    wherein first light sources for irradiating white light are provided independently and respectively for the first light irradiating device and the second light irradiating device.

2. The bonding apparatus of claim 1,
wherein the first light sources are LEDs.

3. The bonding apparatus of claim 1,
wherein the white light is synthesized by emitting lights of a plurality of colors all at once.

4. The bonding apparatus of claim 2,
wherein the white light is synthesized by emitting lights of a plurality of colors all at once.

5. The bonding apparatus of claim 3,
wherein the plurality of colors includes red, green and blue.

6. The bonding apparatus of claim 4,
wherein the plurality of colors includes red, green and blue.

7. The bonding apparatus of claim 1,
wherein the white light has a wavelength band ranging from about 430 nm to about 700 nm.

8. The bonding apparatus of claim 2,
wherein the white light has a wavelength band ranging from about 430 nm to about 700 nm.

9. The bonding apparatus of claim 1,
wherein each of the first light irradiating device and the second light irradiating device is further connected to a second light source configured to irradiate light other than the white light, and
the first light irradiating device and the second light irradiating device are allowed to switch irradiation of the light from the first light source and irradiation of the light from the second light source.

10. The bonding apparatus of claim 2,
wherein each of the first light irradiating device and the second light irradiating device is further connected to a second light source configured to irradiate light other than the white light, and
the first light irradiating device and the second light irradiating device are allowed to switch irradiation of the light from the first light source and irradiation of the light from the second light source.

11. The bonding apparatus of claim 9,
wherein the light other than the white light irradiated by the second light irradiating device is red light.

12. The bonding apparatus of claim 10,
wherein the light other than the white light irradiated by the second light irradiating device is red light.

* * * * *